US006477688B1

(12) United States Patent
Wallace

(10) Patent No.: US 6,477,688 B1
(45) Date of Patent: Nov. 5, 2002

(54) LOGIC EQUIVALENCE LEVERAGED PLACEMENT AND ROUTING OF AN IC DESIGN

(76) Inventor: David E. Wallace, 3308 Monika La., Hayward, CA (US) 94541

( * ) Notice: Subject to any disclaimer, the term of this patent is extended or adjusted under 35 U.S.C. 154(b) by 0 days.

(21) Appl. No.: 09/470,086

(22) Filed: Dec. 22, 1999

Related U.S. Application Data

(63) Continuation-in-part of application No. 09/470,540, filed on Dec. 22, 1999, which is a continuation-in-part of application No. 09/118,225, filed on Jul. 17, 1998.

(51) Int. Cl.$^7$ .............................................. G06F 17/50
(52) U.S. Cl. ......................................... 716/10; 716/13
(58) Field of Search ...................................... 716/1–21

(56) References Cited

U.S. PATENT DOCUMENTS

| | | | | | |
|---|---|---|---|---|---|
| 5,618,744 | A | * | 4/1997 | Suzuki et al. ................ | 438/599 |
| 5,808,899 | A | * | 9/1998 | Scepanovic et al. ........... | 716/2 |
| 6,272,668 | B1 | * | 8/2001 | Teene ........................... | 716/10 |
| 6,282,693 | B1 | * | 8/2001 | Naylor et al. .................. | 716/8 |
| 6,289,490 | B1 | * | 9/2001 | Boyd et al. .................... | 716/2 |

OTHER PUBLICATIONS

Doom et al. ("Identifying high–level components in combinational circuits", Proceedings of the 8th Great Lakes Symposium on VLSI, Feb. 19, 1998, pp. 313–318).*
Takeya et al. ("A generator for high–density macrocells with hierarchical structure", Proceedings of the IEEE 1989 Custom Integrated Circuits Conference, May 15, 1989, pp. 23.5/1–23.5/4).*

Tsay ("An exact zero–skew clock routing algorithm", IEEE Transactions on Computer–Aided Design of Integrated Circuits and Systems, vol. 12, No. 2, pp. 242–249).*
Ghosh et al. ("Synthesis of wiring signature–invariant equivalence class circuit mutants and applications to benchmarking", Proceedings of Design, Automation and Test in Europe, Feb. 23, 1998, pp. 656–663).*
Hassoun et al. ("Regularity extraction via clan–based structural circuit decomposition", IEEE/ACM International Conference on Computer–Aided Design, Nov. 7, 1999, pp. 414–418).*
NB8909290 ("Method to Improve Chip Wiring", IBM Technical Disclosure Bulletin, vol. 32, No. 4B, Sep. 1989, pp. 290–293 (6 pages)).*
Valeria Bertacco & Maurizio Damiani, "Boolean Function Representation Based on Disjoint–Support Decompositions", ICCD96, Oct. 1996, pp. 27–32, IEEE Computer Society Press, Los Alamitos, CA, USA.

(List continued on next page.)

Primary Examiner—Vuthe Siek
Assistant Examiner—Phallaka Kik
(74) Attorney, Agent, or Firm—Blakely Sokoloff Taylor & Zafman LLP

(57) ABSTRACT

At least one EDA tool is provided with first and second plurality of programming instructions. The first plurality of programming instructions are designed to determine equivalent logic in an IC design, and the second plurality of programming instructions are designed to place and route the IC design. The place and route operation includes performance of at least one place and route operation selected from a group of place and route operations consisting of choosing coupling assignments for nets and logically equivalent input pins of the IC design, and choosing coupling assignments for logically equivalent output pins and loads of the IC design.

36 Claims, 3 Drawing Sheets

OTHER PUBLICATIONS

Valeria Bertacco & Maurizio Damiani, "The Disjunctive Decomposition of Logic Functions", ICCD97, Nov. 1997, pp. 78–82, IEEE Computer Society, Los Alamitos, CA, USA.

S–C. Chang, K–T. Cheng, N–S. Woo & M. Marek–Sadowska, "Layout Driven Logic Synthesis for FPGAs", DAC94, Jun. 1994, pp. 308–313.

P. Chong, Y. Jiang, S. Khatri, S. Sinha & R. Brayton, "Don't Care Wires in Logical/Physical Design", International Workshop on Logic Synthesis (IWLSOO), Nov. 1, 1999, pp. 1–9.

Luis Entrena & Kwang–Ting Cheng, "Sequential Logic Optimization By Redundancy Addition And Removal", ICCAD93, Nov. 1993, pp. 310–315, IEEE Computer Society Press, Los Alamitos, CA, USA.

Hans T. Heineken & Wojciech Maly, "Interconnect Yield Model for Manufacturability Prediction in Synthesis of Standard Cell Based Designs", ICCAD96, Nov. 1996, pp. 368–373, IEEE Computer Society Press, Los Alamitos, CA, USA.

Yusuke Matsunaga, "An Exact and Efficient Algorithm for Disjunctive Decomposition", SASIMI98, Oct. 1998, pp. 44–50.

Dirk Moller, Janett Mohnke & Michael Weber, "Detection of Symmetry of Boolean Functions Represented by ROBDDs", ICCAD93, Nov. 1993, pp. 680–684, IEEE Computer Society Press, Los Alamitos, CA, USA.

K. H. Tsai, et al., "A High Speed Test Pattern Generator for Large Scan Designs," ITC International Test Conference, Paper 382, IEEE, 1999, pp. 1021–1030.

Mandalagiri S. Chandrasekhar, Robert H. McCharles and David E. Wallace, "Effective Coupling between Logic Synthesis and Layout Tools for Synthesis of Area and Speed–Efficient Circuits", VLSI Design, 1997, vol. 5, No. 2, pp. 125–140, Jan. 1997.

D. Brasen, T. Schaefer, A. Ginetti, S. Chu, Compass Design Automation, "Post–Placement Buffer Reoptimization", 1992 IEEE, pp. 156–161, Jun. 1992.

* cited by examiner

LOGIC EQUIVALENCE LEVERAGED PLACEMENT AND ROUTING OF AN IC DESIGN

RELATED APPLICATIONS

This application is a continuation-in-part application to application Ser. No. 09/470,540, filed Dec. 22, 1999 entitled "Additional Logic Equivalence Identification Technique", filed contemporaneously, which is a continuation-in-part application to application Ser. No. 09/118,225 entitled "Digital Circuit Layout Techniques", filed on Jul. 17, 1998. Both applications Ser. Nos. 09/470,540 and 09/118,225 are hereby fully incorporated by reference.

BACKGROUND OF THE INVENTION

1. Field of the Invention

The present invention pertains to the fields of integrated circuit (IC) design. More particularly, this invention relates to electronic design automation (EDA) tools employed to assist placement and routing of an IC design.

2. Background

Logic equivalence identifies classes of permutable pins (or nets) with an IC design. In application Ser. No. 09/118, 225, digital circuit layout techniques including in particular techniques for identifying logic equivalency in an IC design were disclosed. In application Ser. No. 09/470,540, additional techniques for identifying logic equivalency in an IC design were disclosed.

Such pins (or nets) may be swapped without impacting the logic of the IC design. In particular once identified these pins (or net) may be swapped to reduce wire length, improve circuit timing or reduce routing congestion, when placing and routing an IC design. Thus, an improved machine implemetable place and route technique that leverages on the identified logic equivalents, when placing and routing an IC design is desired.

SUMMARY OF THE INVENTION

At least one EDA tool is provided with first and second plurality of programming instructions. The first plurality of programming instructions are designed to determine equivalent logic in an IC design, and the second plurality of programming instructions are designed to place and route the IC design. The place and route operation includes performance of at least one place and route operation selected from a group of place and route operations consisting of choosing coupling assignments for nets and logically equivalent input pins of the IC design, and choosing coupling assignments for logically equivalent output pins and loads of the IC design.

In one embodiment, coupling assignments are chosen to minimize total wire length of an IC design. The coupling assignment selection problem is formulated as a bi-partite matching problem, more specifically, a weighted matching problem. Manhattan distances are employed in weight assignments, and penalty costs are added for congested areas. In one embodiment, coupling assignments are chosen to minimize selected total delay times. The coupling assignment selection problem is also formulated as a bi-partite matching problem, more specifically, a max-min matching problem. Slack times are determined in accordance with arrival and required times.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In the following description, various aspects of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to one skilled in the art that the present invention may be practiced without the specific details. In other instances, well known features are omitted or simplified in order not to obscure the present invention.

The description will be presented using terminology consistent with the manner commonly employed by those skilled in the art to convey the substance of their work to others skilled in the art, including terms such as nodes, arcs, weights, assigning, sorting, adding, and so forth. As well understood by those skilled in the art, these quantities/operations take the form of electrical, magnetic, or optical signals capable of being stored, transferred, combined, and otherwise manipulated through mechanical and electrical components of a computer system. The term computer system includes general purpose as well as special purpose data processing machines, systems, and the like, that are standalone, adjunct or embedded.

Various operations will be described as multiple discrete steps in turn, in a manner that is most helpful in understanding the present invention. However, the order of description should not be construed as to imply that these operations must be performed in the order they are presented, or the operations are necessarily order dependent.

The phrase "in one embodiment" will be used repeatedly. The phrase in general does not refer to the same embodiment, although it may.

Figure 1:
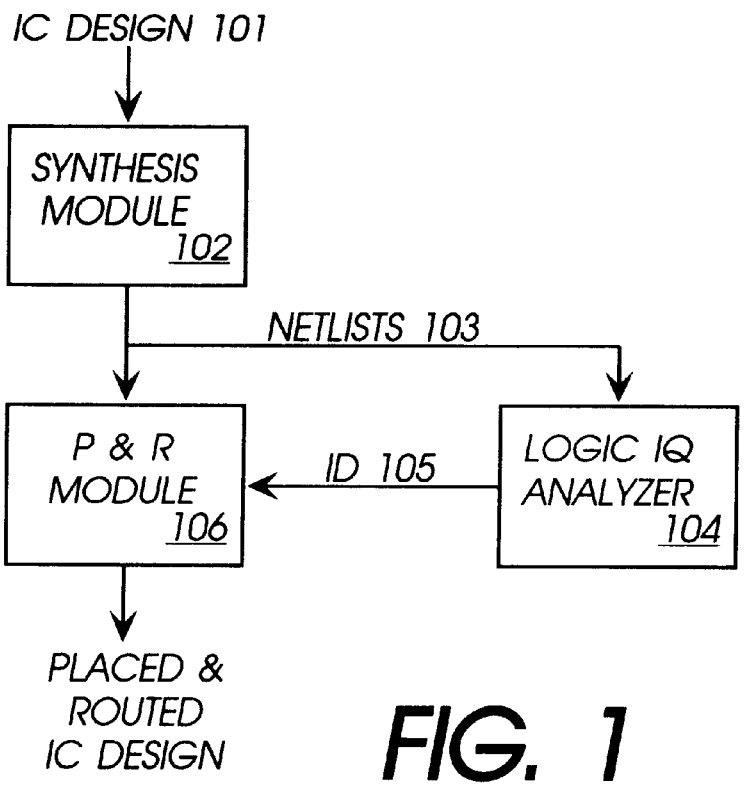
FIG. 1 is a block diagram illustrating an EDA tool suite incorporated with the teachings of the present invention, in accordance with one embodiment.

Referring now to FIG. 1, wherein a block diagram illustrating an EDA tool incorporated with the teachings of the present invention, in accordance with one embodiment. As illustrated, EDA tool suite 100 includes synthesis module 102, logic equivalence analyzer 104 and place and route module 106, operationally coupled to each other as shown. Synthesis module 102 receive formally described IC design 101 as input, and in response, generates netlists 103 of electronic elements (hereinafter, simply netlists) for IC design 101. Logic equivalence analyzer 104 receives netlists 103 as inputs, and identifies equivalent logic 105, including permutable input as well as output pins. Place and route module 106 receives netlists 103 as well as identification information of the equivalent logic 105 as inputs, and place and route IC design 101, leveraging on the equivalent logic 105 identified.

In one embodiment, when placing and routing an IC design, place and route module 106 determines coupling assignments for nets to be coupled to permutable logically equivalent input pins, and the logically equivalent input pins, minimizing their aggregate contributions to total wire length of the IC design. In one embodiment, when placing and routing an IC design, place and route module 106 also determines coupling assignments for logically equivalent output pins, and the loads driven by the logically equivalent output pins, minimizing their aggregate contributions to total wire length of the IC design.

In another embodiment, when placing and routing an IC design, place and route module 106 determines coupling assignments for a group of nets to be coupled to a group of permutable logically equivalent input pins, and the group of logically equivalent input pins, minimizing the total timing delays between these elements. In yet another embodiment, when placing and routing an IC design, place and route module 106 also determines coupling assignments for a group of logically equivalent output pins, and the loads driven by the logically equivalent output pins, minimizing the total timing delay between these elements.

In one embodiment, the selected ones of the aforementioned determinations are performed per user inputs, which may be provided to place and route module 106 using any one of a number of user input techniques known in the art.

IC design may be formally described using any one of a number of IC description language known in the art, e.g. VLSI Hardware Description Language (VHDL). Synthesis module 102 is intended to represent a broad range of such tools known in the art. Examples of such tools are LeonardoSpectrum™ and LeonardoInsight™ available from Exemplar Logic Corporation of San Jose, Calif. Logic equivalence analyzer 104 is described in detail in the parent application, which is hereby fully incorporated by reference. Except for the teachings of the present invention incorporated in place and route module 106, place and route module 106 is also otherwise intended to represent a broad range of such tools known in the art. An example of such tool is Microroute™, available from Mentor Graphics Corporation of Wilsonville, Oreg. Thus, except for the teachings of the present invention incorporated in place and route (hereinafter, P&R) module 106, elements 102–106 will not be otherwise further described.

Figure 2:
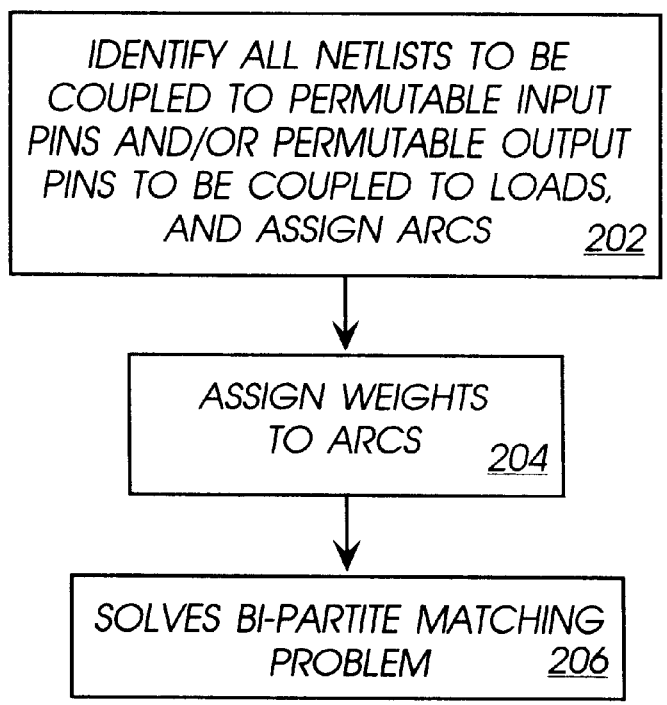
FIG. 2 is a block diagram illustrating the operational flow of the place and route module of FIG. 1 for selecting coupling assignments, minimizing total wire length of the IC design, in accordance with one embodiment.

FIG. 2 is a block diagram illustrating the operational flow of P&R module 106 for choosing coupling assignments that minimize aggregate contributions to total wire length of the IC design, in accordance with one embodiment. For the illustrated embodiment, P&R module 106 formulates and solves the coupling assignment problem as a bipartite matching problem. At 202, using the identification information provided by logic equivalence analyzer 104, P&R module 106 identifies, for each group of equivalence, all nets to be coupled to permutable input pins, and permutable output pins, and assigns nodes in a first set (hereinafter the "S" set) to represent these nets and permutable output pins. Using the same identification information, P&R module 106 further identifies the permutable input pins, and the loads driven by the permutable output pins, and similarly assigns nodes in a second set (hereinafter the "T" set) to represent these permutable input pins and loads. Lastly, in 202, P&R module 106 assigns an arc (connecting eligible pairs of the nodes of the two sets) to represent the candidate coupling assignment for the eligible couplings. For example, if net A may be coupled to permutable logically equivalent input pins p1, p2 and p3, three arcs representing the three candidate coupling assignments between A and p1, A and p2, and A and p3 will be assigned. Likewise, if permutable logically equivalent output pins p4 and p5 may be coupled to drive load Z, two arcs representing the two candidate coupling assignments between p4 and Z and p5 and Z will be assigned.

Next, at 204, P&R module 106 correspondingly assigns weights to the arcs. In one embodiment, the assigned weight is W−d(s t), where d(s t) is the Manhattan distance from the driver of a source net (or an output pin), s, to an input pin (or a load) t, and W is a large number larger than any d(s t). In an alternate embodiment, when assigning a weight to an arc representing a candidate coupling assignment coupling a net to an input pin, P&R module 106 set d(s t) to be the Manhattan distance from the remainder of the net to the input pin instead. In yet another embodiment, a penalty cost is further added to the assigned weight of an arc, if the arc represents a coupling assignment that will go through a congested area. Congestion may be defined in an application dependent manner known in the art, e.g. wire density per unit area, and the penalty cost may be any application dependent cost function, linear or non-linear.

Finally, at 206, P&R module 106 solves the bi-partite matching problem formulated as set forth above, by selecting a collection of coupling assignments that minimizes the total assigned weight, thereby minimizing the total wire length of the IC design. Techniques for solving bi-partite matching problems are known in the art, accordingly will not be further described here.

Note that in alternate embodiments, weight may be assigned using d(s, t); the problem would be solved as a minimization problem instead. The term "remainder" of the net as used herein refers to the "rest" of the net, excluding the equivalent candidate under consideration. Consider a situation where load A is linearly disposed to the left of a 3-pin net, L1-D-L2, where L1 and L2 are loads, and D is a driver. A and L2 are considered to be logically equivalent. The distances between the elements A, L1, D and L2 are d1, d2 and d3 respectively, with d1+d2 being larger than d3, but d1 is smaller than d3 (i.e. A is farther away from D than L2). However, by virtue of the fact that L1 has to be connected to D, with d1 smaller than d3, A is said to be closer to the "remainder" or "rest" of the net (L1-D), than L2. Accordingly, from a minimizing wire length perspective, A is considered to be a "better" selection than L2, to be coupled to the "remainder" or the "rest" of the net (L1-D).

Figure 3A:
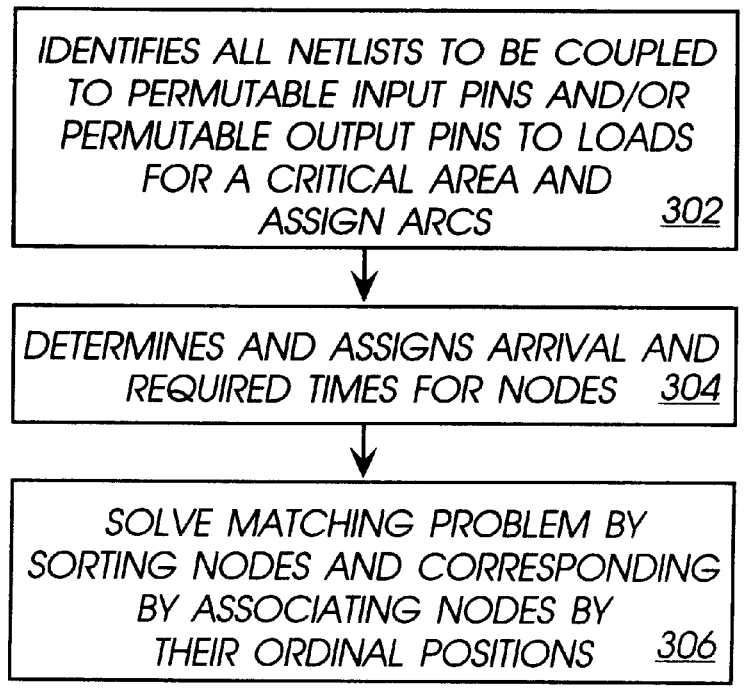
FIGS. 3a–3b are two block diagrams illustrating the operational flow of the place and route module of FIG. 1 for selecting coupling assignments, minimizing total timing delay for a critical area of the IC, in accordance with two embodiments.
Figure 3B:
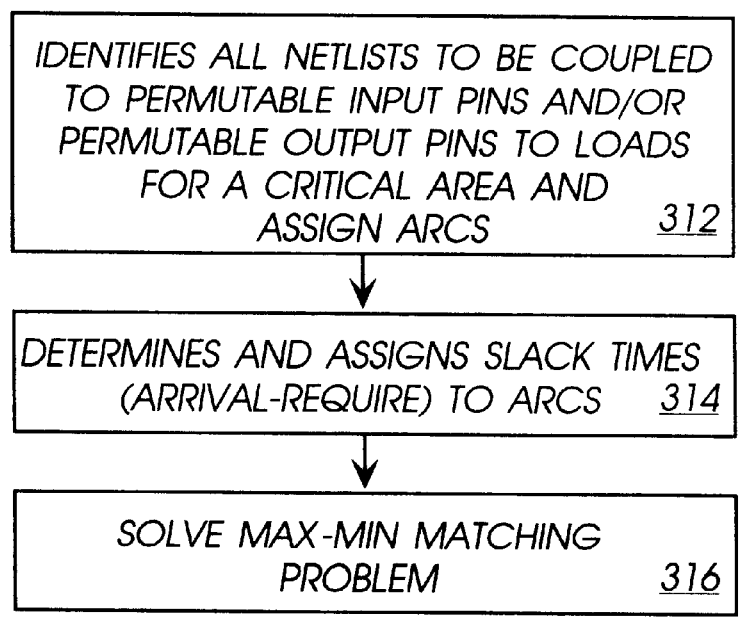

FIGS. 3a–3b are two block diagrams illustrating the operational flow of place and route module 106 for choosing coupling assignments that minimize total time delay between the elements being coupled, in accordance with two embodiments. In the embodiment of FIG. 3a, P&R module 106 formulates and solves the coupling assignment problem using a sort and match approach. In the embodiment of FIG. 3b, P&R module 106 formulates and solves the coupling assignment problem as a max-min matching problem.

In either case, at 302 or 312, P&R module 106 using the identification information provided by logic equivalence analyzer 104, P&R module 106 identifies for a critical area, all nets to be coupled to permutable input pins (or permutable output pins), and assigns nodes in the "S" set to represent these nets (or permutable output pins). Using the same identification information, P&R module 106 further identifies for the critical area, the permutable input pins (or the loads driven by the permutable output pins), and similarly assigns nodes in the "T" set to represent these permutable input pins (or loads). Lastly, in 302 or 312, P&R module 106 assigns an arc (connecting eligible pairs of the nodes of the two sets) to represent the candidate coupling assignment for the eligible couplings.

Next, in the case of FIG. 3a, P&R module 106 determines and assigns arrival times for the nodes in the S set and required times for the nodes in the T set, 304. The arrival and required times may be retrieved from a design timing database provided by the designer, or estimated using any one of a number of modeling techniques known in the art. Then, at 306, P&R module 106 solves the matching problem formulated as set forth above, by sorting the nodes of the two sets, by arrival time and required time respectively, and correspondingly matching the nodes of the two sets in accordance with their ordinal positions the sorted lists, to form the coupling assignment that minimizes the total timing delay for the critical area. That is, the net (or output pin) with the earliest arrival time is coupled to the input pin (or load) with the earliest required time, the net (or output pin) with the second earliest arrival time is coupled to the input pin (or load) with the second earliest required time, and so forth. Sorting techniques are well known, accordingly will not be further described here.

In the case of FIG. 3b, P&R module 106 similarly determines and assigns arrival times for the nodes in the S set and required times for the nodes in the T set, 314. However, P&R module 106 then determines the slack time (required time−arrival time) for each of the arc representing a candidate coupling assignment. Then, at 316, P&R module 106 solves the matching problem formulated as set forth above, by maximizing the worst slack times, and form the coupling assignment accordingly. Techniques for solving max-min matching problems are also known in the art, accordingly will not be further described here.

The coupling assignment determined for a critical area as described earlier referencing FIG. 3b is suffice if P&R module 106 is to provide a minimal delay solution. However, in alternate embodiment, P&R module 106 may be implemented in a manner such that once the worse case slack time is found, arcs with lesser slack times are eliminated. Then, the remaining arcs are re-weighted using one of the earlier described wire length formulations, and the revised problem is re-solved as a weight matching problem. Accordingly, the coupling assignment solution may minimize wire length, subject to maximizing the slack time. Various other modifications may also be made to tailor P&R module 106 to other specific application of interest, leveraging the logic equivalents identified by analyzer 104.

In addition to the wire-length and delay time approaches described above, in alternate embodiments, special cost functions may also be employed to address certain special characteristics of an integrated circuit. For example, in the case of Field Programming Gate Arrays (FPGAs), each FPGA typically has a fixed set of configurable routing resources that are used to interconnect cells on the chip. This means that wire length effect are discrete, rather than continuous. There may be one set of routing resources that can be used to connect to other cells in the same local cluster, another to connect to other cells in the same row, and yet another to connect to cells in different rows. If a given routing resources is used, the cost is essentially the same no matter which cell in the target group is connected to, nor how many such cells are connected to. Thus, the key consideration in this situation is not how far apart two cells are in Manhattan distance, but rather which routing resources are needed to connect them. These effects can be modeled by minimizing a cost function that is related to the routing resources required (rather than by minimizing wire length per se). An example cost function may assign a cost of 0 to a connection to a cell in the same local cluster, a cost of 3 to a connection to a cell in the same row, and a cost of 7 to a connection to a cell in a different row. The cost 1, 3 and 7 are arbitrarily, and illustrative only. Other cost functions may also be used For multi-pin nets, it should also be noted that once a given routing resource has already been used for a given net, there is no additional cost for other connections on the net using the same routing resources. Thus, an approach similar to the earlier described "remainder" approach, measuring the additional routing resources required to connect to the rest of the net (and not the distance) may be used.

Figure 4:
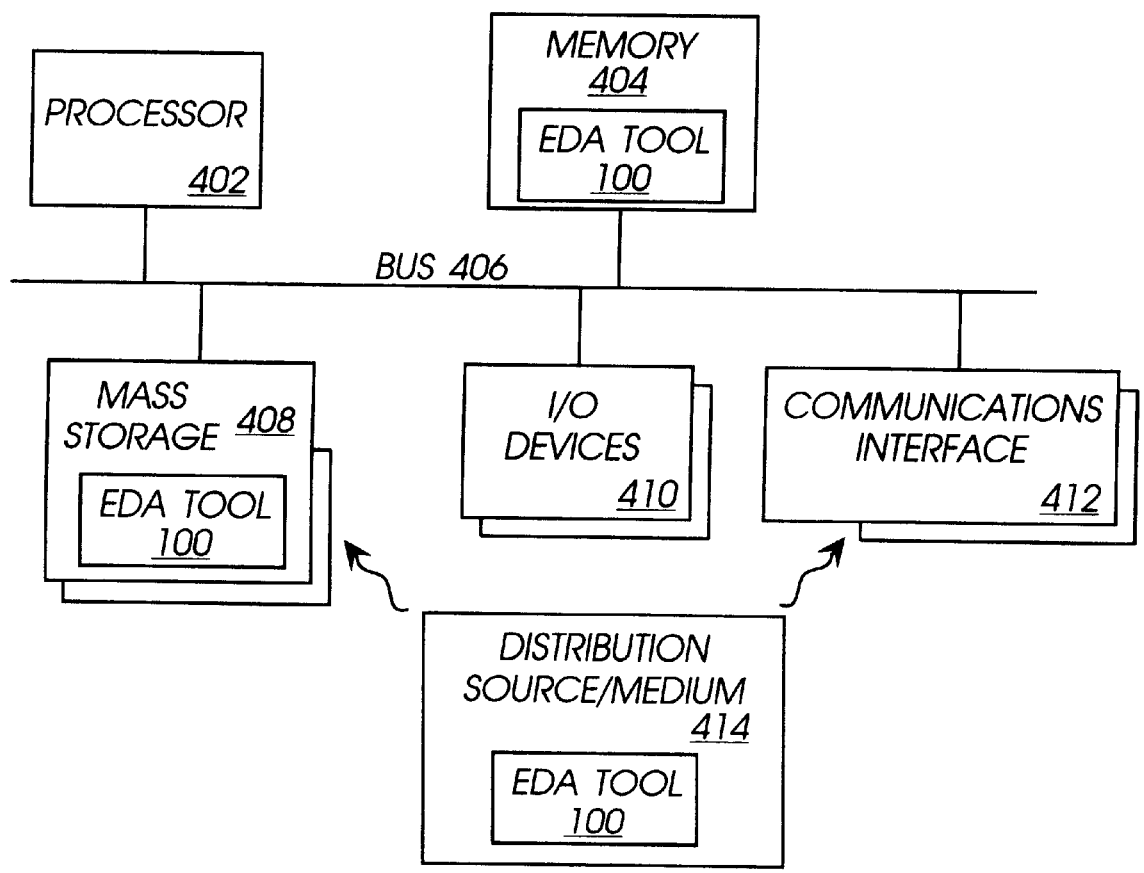
FIG. 4 is a block diagram illustrating an example computer system suitable for practicing the present invention.

FIG. 4 illustrates one embodiment of a computer system suitable for use to practice the present invention. As shown, computer system 400 includes processor 402 and memory 404 coupled to each other via system bus 406. Coupled to system bus 406 are non-volatile mass storage 408, such as hard disks, floppy disk, and so forth, input/output devices 410, such as keyboard, displays, and so forth, and communication interfaces 412, such as modem, LAN interfaces, and so forth. Each of these elements performs its conventional functions known in the art. In particular, system memory 404 and non-volatile mass storage 408 are employed to store a working copy and a permanent copy of the programming instructions implementing the above described teachings of the present invention. The programming instructions may be any programming instructions known in the art, including but not limited to C, C++, Assembler, and so forth. System memory 404 and non-volatile mass storage 406 may also be employed to store the IC designs, including the identified equivalents as well as other data. The permanent copy of the programming instructions to practice the present invention may be loaded into non-volatile mass storage 408 in the factory, or in the field, using distribution source/medium 414 and optionally, communication interfaces 412. Examples of distribution medium 414 include recordable medium such as tapes, CDROM, DVD, and so forth. The constitution of elements 402–414 are well known, and accordingly will not be further described.

While for ease of understanding, the present invention has been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

Thus, an improved place and route technique that leverages on logic equivalence when performing placement and routing has been described.

What is claimed is:

1. A machine implemented IC design method comprising:
   (a) determining equivalent logic in an IC design; and
   (b) performing place and route operations to place and route the IC design, including performing at least one place and route operation selected from a group of place and route operations consisting of choosing coupling assignments for nets and logically equivalent input pins of the IC design, and choosing coupling assignments for logically equivalent output pins to loads of the IC design.

2. The method of claim 1, wherein said choosing of coupling assignments for nets and logically equivalent input pins comprises choosing coupling assignments for said nets and logically equivalent input pins that minimize aggregate contributions to total wire length of the IC design.

3. The method of claim 2, wherein said choosing of coupling assignments for nets and logically equivalent input pins that minimize aggregate contributions to total wire length of the IC design comprises formulating a bi-partite matching problem for said nets and logically equivalent input pins, assigning weights reflective of wiring lengths to arcs representing candidate coupling assignments between said nets and logically equivalent input pins, and determining a solution to a weighted bipartite matching problem.

4. The method of claim 3, wherein said assignment of weights reflective of wiring lengths to arcs representing candidate coupling assignments between said nets and logically equivalent input pins comprises determining Manhattan distances between drivers of said nets and said logically equivalent input pins.

5. The method of claim 3, wherein said assignment of weights reflective of wiring lengths to arcs representing candidate coupling assignments between said nets and logically equivalent input pins comprises determining Manhattan distances between remainders of said nets and said logically equivalent input pins.

6. The method of claim 2, wherein said choosing of coupling assignments for nets and logically equivalent input pins that minimize aggregate contributions to total wire length of the IC design further comprises assigning penalty cost to selected ones of said arcs representing candidate coupling assignments between said nets and logically equivalent input pins that go through congested areas.

7. The method of claim 1, wherein said choosing of coupling assignments for nets and logically equivalent input pies comprises choosing a set of coupling assignments for a group of nets and a group logically equivalent input pins that minimize total delay time between said group of nets and said group of logically equivalent input pins.

8. The method of claim 7, wherein said choosing of a set of coupling assignments for a group of nets and a group of logically equivalent input pins that minimize total delay time between the group of nets and the group of logically equivalent input pins comprises assigning arrival times to a first set of nodes representing the group of nets, assigning required times to a second set of nodes representing the group of logically equivalent input pins, sorting the first and second set of nodes in accordance with the assigned arrival and required times respectively, and corresponding matching the two sets of nodes.

9. The method of claim 7, wherein said choosing of a set of coupling assignments for a group of nets and a group of logically equivalent input pins that minimize total delay time between the group of nets and the group of logically equivalent input pins comprises formulating a max-min matching problem for the group of nets and the group of logically equivalent input pins, assigning a slack value to each arc representing a candidate coupling assignment for a net and a logically equivalent input pin based on arrival and required times of the net and the logical equivalent input pin, and solving the max-min matching problem.

10. The method of claim 7, wherein said choosing of coupling assignments for nets and logically equivalent input pins further comprises choosing coupling assignments for said nets and logically equivalent input pins that minimize aggregate contributions to total wire length of the IC design, after performing said choosing of a set of coupling assignments for a group of nets and a group logically equivalent input pins that minimize total delay time.

11. The method of claim 1, wherein said choosing of coupling assignments for nets and logically equivalent input pins comprises choosing coupling assignments for said nets and logically equivalent input pins that minimize an interconnect resource consumption cost function.

12. The method of claim 1, wherein said choosing of coupling assignments for logically equivalent output pins and loads comprises choosing coupling assignments for said logically equivalent output pins and said loads that minimize aggregate contributions to total wire length of the IC design.

13. The method of claim 12, wherein said choosing of coupling assignments for logically equivalent output pins and loads that minimize aggregate contributions to total wire length of the IC design comprises formulating a bi-partite matching problem for said logically equivalent output pins and said loads, assigning weights reflective of wiring lengths to arcs representing candidate coupling assignments between said logically equivalent output pins and said loads, and determining a solution to the weighted bi-partite matching problem.

14. The method of claim 13, wherein said assignment of weights reflective of wiring lengths to arcs representing candidate coupling assignments between said logically equivalent output pins and loads comprises determining Manhattan distances between said logically equivalent output pins and said loads.

15. The method of claim 13, wherein said choosing of coupling assignments for logically equivalent output pins and loads that minimize aggregate total wire length of the IC design further comprises assigning penalty cost to selected ones of said arcs representing candidate coupling assignments between said logically equivalent output pins and loads that go through congested areas.

16. The method of claim 12, wherein said choosing of coupling assignments for logically equivalent output pins and loads comprises choosing a set of coupling assignments for a group of logically equivalent output pins and a group of loads that minimize total delay time between said group of logically equivalent output pins and said loads.

17. The method of claim 16, wherein said choosing of a set of coupling assignments for a group of logically equivalent output pins and a group of loads that minimize total delay time between the group of logically equivalent output pins comprises assigning arrival times to a first set of nodes representing the group of logically equivalent output pins, assigning required times to a second set of nodes representing the group of loads, sorting the first and second set of nodes in accordance with the assigned arrival and required times respectively, and corresponding matching the two sets of nodes.

18. The method of claim 16, wherein said choosing of a set of coupling assignments for a group of logically equivalent output pins and a group of loads that minimize total delay time between the group of logically equivalent output pins comprises formulating a max-min matching problem for the group of logically equivalent input pins and the group of loads, assigning a slack value to each arc representing a candidate coupling assignment for a logically equivalent output pin and a load based on arrival and required times of the logical equivalent output pin and load, and solving the max-min matching problem.

19. The method of claim 16, wherein said choosing of coupling assignments for logically equivalent output pins and loads further comprises choosing coupling assignments for said logically equivalent output pins and said loads that minimize aggregate contributions to total wire length of the IC design, after performing said choosing of a set of coupling assignments for a group of logically equivalent output pins and a group of loads that minimize total delay time.

20. The method of claim 1, wherein said choosing of coupling assignments for logically equivalent output pins and loads comprises choosing coupling assignments for said logically equivalent output pins and said loads that minimize an interconnect resource consumption cost function.

21. An apparatus comprising:
(a) a storage medium having stored therein-first plurality of programming instructions, with the first plurality of programming Instructions designed to place and route an IC design, including performance of at least one place and route operation selected from a group of place and route operations consisting of choosing coupling assignments for nets and logically equivalent input pins of the IC design, and choosing coupling assignments for logically equivalent output pins and loads of the IC design; and
(b) a processor coupled to the storage medium to execute said first plurality of programming instructions.

22. The apparatus of claim 21, wherein said first plurality of programming instructions are further designed to choose coupling assignments for said nets and logically equivalent input pins that minimize aggregate contributions to total wire length of the IC design.

23. The apparatus of claim 21, wherein said first plurality of programming instructions are further designed to choose a set of coupling assignments for a group of nets and a group of logically equivalent input pins that minimize total delay time between said group of nets and said group of logically equivalent input pins.

24. The apparatus of claim 21, wherein said first plurality of programming instructions are further designed to choose coupling assignments for said nets and logically equivalent input pins that minimize an interconnect resource consumption cost function.

25. The apparatus of claim 21, wherein said first plurality of programming instructions are further designed to choose coupling assignments for said logically equivalent output pins and said loads that minimize aggregate contributions to total wire length of the IC design.

26. The apparatus of claim 21, wherein said first plurality of programming instructions are further designed to choose a set of coupling assignments for a group of logically equivalent output pins and a group of loads that minimize total delay time between said group of logically equivalent output pins and said loads.

27. The apparatus of claim 21, wherein said first plurality of programming instructions are further designed to choose coupling assignments for said logically equivalent output pins and said loads that minimize an interconnect resource consumption cost function.

28. The apparatus of claim 21, wherein
the storage medium further having stored therein a second plurality of programming instructions, with the second plurality of programming instructions designed to determine equivalent logic in the IC design; and the processor further executes said second plurality of programming instructions.

29. An article of manufacture comprising:
a recordable medium having recorded thereon machine executable first plurality of programming instructions, with the first plurality of programming instructions designed to place and route an IC design, including performance of at least one place and route operation selected from a group of place and route operations consisting of choosing coupling assignments for nets and logically equivalent input pins of the IC design, and choosing coupling assignments for logically equivalent output pins and loads of the IC design.

30. The article of manufacture claim 29, wherein first plurality of programming instructions are further designed to choose coupling assignments for said nets and logically equivalent input pins that minimize aggregate contributions to total wire length of the IC design.

31. The article of manufacture of claim 29, wherein first plurality of programming instructions are further designed to choose a set of coupling assignments for a group of nets and a group of logically equivalent input pins that minimize total delay time between said group of nets and said group of logically equivalent input pins.

32. The article of manufacture claim 29, wherein first plurality of programming instructions are further designed to choose coupling assignments for said nets and logically equivalent input pins that minimize an interconnect resource consumption cost function.

33. The article of manufacture of claim 29, wherein first plurality of programming instructions are further designed to choose coupling assignments for said logically equivalent output pins and said loads that minimize aggregate contributions to total wire length of the IC design.

34. The article of manufacture of claim 29, wherein first plurality of programming instructions are further designed to choose a set of coupling assignments for a group of logically equivalent output pins and a group of loads that minimize total delay time between said group of logically equivalent output pins and said loads.

35. The article of manufacture of claim 29, wherein first plurality of programming instructions are further designed to choose coupling assignments for said logically equivalent output pins and said loads that minimize an interconnect resource consumption cost function.

36. The article of claim 29, wherein the recordable medium further having recorded thereon machine executable second plurality of programming instructions, designed to determine logic equivalents in the IC design.

* * * * *